United States Patent [19]

Goetz et al.

[11] Patent Number: 5,448,826

[45] Date of Patent: Sep. 12, 1995

[54] METHOD OF MAKING CERAMIC MICROWAVE ELECTRONIC PACKAGE

[75] Inventors: Martin Goetz; Joseph Babiarz, both of San Diego, Calif.

[73] Assignee: Stratedge Corporation, San Diego, Calif.

[21] Appl. No.: 231,492

[22] Filed: Apr. 22, 1994

Related U.S. Application Data

[62] Division of Ser. No. 134,269, Oct. 8, 1993.

[51] Int. Cl.$^6$ .............................................. H05K 13/00
[52] U.S. Cl. ...................................... 29/848; 29/827; 156/89; 264/61
[58] Field of Search .................... 264/61; 29/827, 828, 29/848; 174/52.4, 16.3, 52.2; 156/89

[56] References Cited

U.S. PATENT DOCUMENTS

| | | | |
|---|---|---|---|
| 3,729,820 | 5/1973 | Ihochi et al. | 174/52.4 X |
| 3,872,583 | 3/1975 | Beall et al. | 29/827 |
| 4,025,716 | 5/1977 | Morse | 174/52.4 |
| 4,304,624 | 12/1981 | Carson et al. | |
| 4,354,107 | 10/1982 | Carson et al. | |
| 4,513,355 | 4/1985 | Schroeder et al. | 174/52.4 X |
| 4,646,128 | 2/1987 | Carson et al. | |
| 4,706,166 | 11/1987 | Go. | |
| 4,764,846 | 8/1988 | Go. | |
| 4,901,041 | 2/1990 | Pengelly. | |
| 4,912,545 | 3/1990 | Go. | |
| 4,941,283 | 2/1991 | Johnson et al. | 264/61 X |
| 5,014,418 | 5/1991 | Wright | 29/827 |
| 5,045,685 | 9/1991 | Wall. | |
| 5,104,820 | 4/1992 | Go et al. | |
| 5,114,642 | 5/1992 | Jung | 264/61 |
| 5,159,750 | 11/1992 | Dutta et al. | 174/52.4 X |

OTHER PUBLICATIONS

"Next-Generation High-Speed Packaging," Gary Holz, MSN & Communications Technology, Jan. 1988, vol. 18, No. 1, pp. 32–40.
"High-Performance Packaging for Monolithic Microwave and Millimeter-wave Integrated Circuits," K. Shalkauser et al., 14th AIAA Conference & Exhibet, Mar. 22–26, 1992, Washington, D.C.
News Article, "Packaging: Making it Fit a Changing Market," Ron Schneiderman, Senior Editor, Microwaves & RF, Feb. 1992, pp. 33–42.
"Mission Accomplished," Mylos F. Suer et al., NASA Tech Briefs, May 1993, vol. 17, No. 5, pp. 14–16.
"Packaging and System Integration of Microwave and Digital Monolithic IC's," Gary L. Holz et al., 1991 IEEE MTT-S Digest, pp. 1059–1062.
"A High Performance Quartz Package for Millimeter-Wave Applications," Y. C. Shih, 1991 IEEE MTT'S Digest, pp. 1063–1066.
"MMIC Packaging with Waffleline," R. W. Perry et al., Microwave Journal, Jun. 1990, pp. 175–182.
"Design Considerations for Microwave Packages," Charles Williams, Ceramic Bulletin, vol. 70, No. 4, 1991, pp. 714–721.
"Low-Cost Package Technology for Advanced MMIC Applications," S. Chai et al, 1990 IEEE MTT'S Digest, pp. 625–628.
"Ceramic and Glass-Ceramic Packaging in the 1990s," Rao R. Tummala, J. Am. Ceram. Soc., vol 75, No. 5, pp. 895–908, 1991.

*Primary Examiner*—Carl J. Arbes
*Attorney, Agent, or Firm*—Brown, Martin Haller & McClain

[57] ABSTRACT

A ceramic microelectronic package suitable for high-frequency microelectronic devices includes a base which is at least partially conductive attached either by seal glass or by solder to a ceramic RF substrate with a cavity formed at its center and a pattern of conductive paths for providing interconnection from the inside to the outside of the package. The base may be metal or ceramic with a metal layer deposited thereon. A ceramic seal ring with a second cavity corresponding to that of the RF substrate, but slightly larger, is attached to the RF substrate by seal glass which is patterned to generally match the dimensions of the seal ring. A ceramic lid is attached to the top of the seal ring by a non-conductive adhesive, such as a polymer adhesive or low temperature seal glass, to seal the package once the microelectronic device has been mounted inside.

11 Claims, 2 Drawing Sheets

METHOD OF MAKING CERAMIC MICROWAVE ELECTRONIC PACKAGE

This application is a divisional of application Ser. No. 08/134,269, filed Oct. 8, 1993.

BACKGROUND OF THE INVENTION

1. Field of the Invention

The present invention relates to a microelectronic package suitable for high frequency devices, using a minimum of conductive materials and a process for making the electronic package. More particularly, the invention relates to a microelectronic package design that eliminates superfluous electrical conductors and can be used as an electronic interconnect housing for high frequency electronic devices and components.

2. Description of Related Art

A key requirement for the packaging of a microelectronic device is that signals move through the package's conductive interconnects in such a way that the electrical interconnection causes minimal change in the signals. It is difficult, however, to fabricate microelectronic packages to achieve minimal signal change at higher frequencies, i.e., greater than 20 Gigahertz (GHz).

A conventional microelectronic package design achieves transfer of signals in and out of the package for frequencies as high as 23 GHz. This package has a metal cover, which must be maintained at the same electrical potential as the electrical circuit ground to achieve such performance. In order to ground the cover, however, internal vias and external side metalization are required. This added metal, in relatively close proximity to the internal circuit and electrical conductors, debases and limits the ultimate performance of the device. Moreover, conventional packages have limited frequency range, excessive transmitted and reflective loss, limited input/output isolation, high cost, and limited reliability, resulting in a lack of general applicability.

Therefore, a need exists for a microelectronic package that eliminates superfluous electrical conductors, provides structural packaging members fabricated from non-conductors and having a relatively uniform dielectric constant, has a high frequency range, and is low in cost without sacrificing reliability.

SUMMARY OF THE INVENTION

Accordingly, the present invention is directed to a ceramic microwave electronic package that substantially obviates one or more of the problems due to limitations and disadvantages of the related art.

Additional features and advantages of the invention will be set forth in the description which follows, and in part will be apparent from the description, or may be learned by practice of the invention. The objectives and other advantages of the invention will be realized and attained by the apparatus and method particularly pointed out in the written description and claims hereof, as well as the appended drawings.

To achieve these and other advantages and in accordance with the purpose of the invention, as embodied and broadly described herein, the invention is a ceramic microelectronic package suitable for high-frequency electronic devices. The package comprises a base having at least partial conductivity and having a top and a bottom; a ceramic RF substrate having a first cavity and a plurality of conductive patterns deposited on the surface of the ceramic RF substrate; means for attaching the ceramic RF substrate to the top of the base; a ceramic seal ring substrate having a second cavity larger than the first cavity; second means for attaching the ceramic seal ring substrate to the ceramic RF substrate, the second attaching means generally matching the dimensions of the seal ring; and a ceramic lid attached to the ceramic seal ring substrate by a non-conductive third attaching means.

In another aspect, the present invention is a process for assembling a ceramic microelectronic package having a base, a ceramic RF substrate, and a ceramic seal ring substrate, each of the base, the ceramic RF substrate, and the ceramic seal ring substrate having a top surface and a bottom surface. The process comprises screen printing a conductive paste on the top surface of the ceramic RF substrate; drying and firing the conductive paste; patterning conductive paths using the conductive paste on the top surface of the ceramic RF substrate; screen printing a first seal glass layer on the top surface of the ceramic RF substrate; drying and glazing the first seal glass layer; screen printing a second seal glass layer on the bottom surface of the ceramic seal ring substrate; drying and glazing the second seal glass layer; subassembling the ceramic RF substrate and the ceramic seal ring substrate; and attaching the top surface of the base to the bottom surface of the ceramic RF substrate.

The step of subassembling the ceramic RF substrate and the ceramic seal ring substrate includes the following substeps: abutting the top surface of the ceramic RF substrate to the bottom surface of the ceramic seal ring substrate to form a subassembly, heating the subassembly, screen printing a metallic material on the bottom surface of the ceramic RF substrate, and drying and firing the metallic material.

The step of attaching the top surface of the base to the bottom surface of the ceramic RF substrate includes the following substeps: applying an adhesive material in the alternative to the top surface of the base or to the bottom surface of the ceramic RF substrate, abutting the top surface of the base to the bottom surface of the ceramic RF substrate to form an assembly, and heating the assembly.

BRIEF DESCRIPTION OF THE DRAWINGS

Understanding of the present invention will be facilitated by consideration of the following detailed description of a preferred embodiment of the present invention taken in conjunction with the accompanying drawings, in which like numerals refer to like parts and in which.

DETAILED DESCRIPTION OF THE INVENTION

Figure 1:
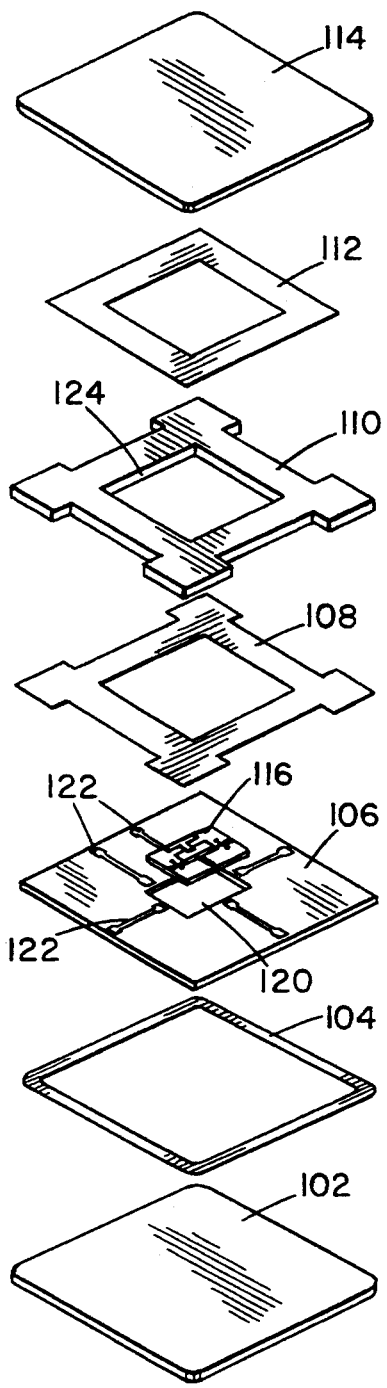
FIG. 1 is a diagrammatical representation of a ceramic microwave electronic package in accordance with the present invention.

An exemplary embodiment of the apparatus of the present invention is shown in FIG. 1 and is designated generally by reference numeral 100.

As embodied and shown in FIG. 1, the present invention includes a base 102, attaching means 104, a ceramic RF substrate 106 with conductive traces 122 patterned thereupon, second attaching means 108, a ceramic seal ring substrate 110, non-conducting third attachment means 112, and a ceramic lid 114. The package 100 is used as an electronic interconnect housing for high frequency (i.e., beyond 20 GHz) devices and components. The details of this package are described below.

The base 102 has multiple uses, including providing a mechanical mount for the package 100 onto a circuit board or carrier, a thermal and electrical mount for the microelectronic devices and other electrical components 116 to be housed in the package, and as a ground reference for the high frequency conductors and other signal traces used as the interconnect. As embodied herein, the base can be made from either of two different types of materials. First, the base can be made of a conductive metal, such as Kovar ®, Invar ®, copper, copper-tungsten, copper-molybdenum, or molybdenum. Each metal offers advantages in electrical and thermal conductivity, structural strength, low coefficient of thermal expansion, and compatibility to electroplated conductors (for example, nickel, silver, silver-platinum, silver-palladium, or gold). The choice of these metals is only exemplary, and one skilled in the art will recognize that other metals can be used for the base 102.

The base can alternatively be made from a ceramic material, compatible with the remainder of the materials used in the package 100. Use of such a ceramic base, however, requires some form of metalization to be applied to certain areas, such as the die attach area for device mounting, for ground connection, or the bottom of the base 102 for attaching the package to a circuit board or carrier. Examples of such ceramic material are aluminum oxide, aluminum nitride, beryllium oxide, fosterite, cordierite, quartz, fused silica, or other ceramics that would have a composition making them usable as a packaging material. Other ceramic materials not enumerated herein, but providing acceptable electrical and physical properties, can be used and would be known to those skilled in the art.

The attaching means 104 comprises some form of adhesive material which will differ depending on whether the base 102 is metal or ceramic. For a metal base, a metallic solder made from some composition providing good adhesion between metals would be applied either to the top of the base 102 or the bottom of the RF substrate 106. An example of such a composition would be gold-germanium or gold-tin composite, although other suitable composites will be apparent to those skilled in the art.

For a ceramic base, either of two types of attaching material may be used. If metalization is applied to the top of the base 102 and the bottom of the RF substrate 106, a metal solder would be applied as described above in the case of a metal base. Alternatively, a glass material, e.g., seal glass, would be applied between the base and the RF substrate 106 in order to adhere the base to the RF substrate. Those skilled in the art will recognize that other solder materials not enumerated herein, but providing acceptable electrical and physical properties, can also be used.

The RF substrate 106 is made of a ceramic material, such as one of the ceramic materials enumerated above with respect to the base 102. The RF substrate 106 has a cavity area 120 cut out of it such that, when attached to the base 102, the RF substrate and base together provide a planar interconnect for a device 116 or devices mounted on the base. Moreover, the RF substrate 106 has a number of conductive patterns 122 deposited on its surface. The RF conductors 122 deposited on the RF substrate have a specific shape, which is designed to maintain a uniform characteristic impedance from end to end of the conductor. This is done through the use of various electrical modeling and simulation software tools, as well as through experimentation. As described above with respect to the attaching means 104, depending on the material chosen for the base 102, the bottom side of the RF substrate may have metalization applied to it in order to attach the RF substrate to the base.

The second attaching means 108 is a glass material (seal glass) deposited on either or both the RF substrate and the seal ring substrate. If seal glass is to be deposited on the RF substrate, it is formed so that the dimensions of the glass deposited on the RF substrate will substantially match those of the seal ring substrate.

Figure 2A:
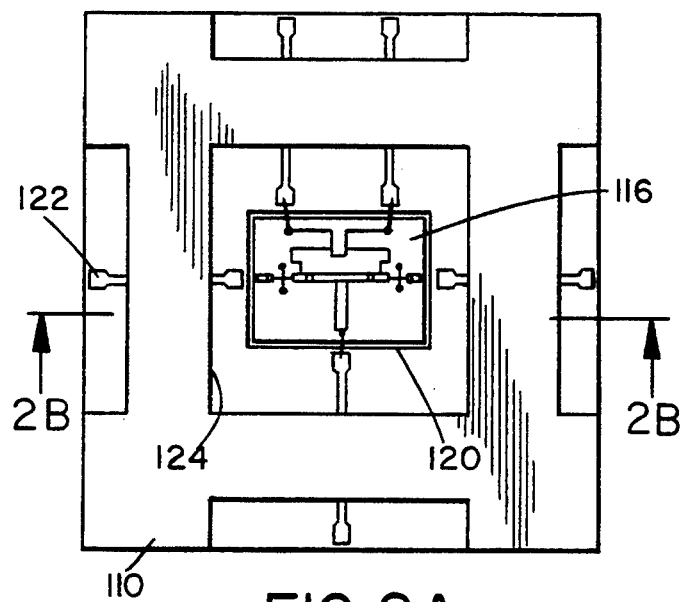
FIG. 2A is a top view of the package of the present invention with the lid removed.
Figure 2B:
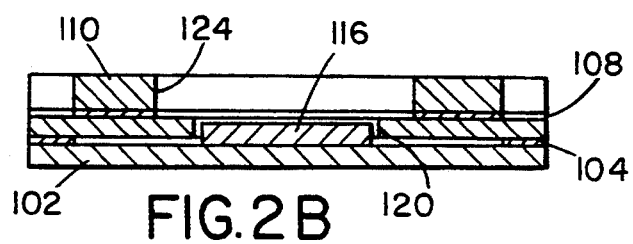
FIG. 2B is a cross-sectional view of the inventive package with the lid removed, taken along line 2B—2B in FIG. 2A.

Seal ring substrate 110 is made of the same or similar material as that used on the ceramic RF substrate layer 106. As described above for the second attaching means 108, if seal glass is to be deposited on the seal ring 110, it is applied to the bottom of the seal ring substrate layer, which, when fused to the RF substrate layer or to glass deposited on the RF substrate layer, creates a hermetic seal between the two substrates. To attain the proper hermeticity and lamination of the seal ring substrate and the RF substrate, when fusing the two substrates together by firing the seal glass, they can be weighted. A cavity 124 is formed in the seal ring substrate which is larger than the cavity formed in the RF substrate. This can be seen in the overhead view provided by FIG. 2A, and the cross-sectional view provided in FIG. 2B. The seal ring substrate cavity is made larger so that a portion of each of the conductors 122 is exposed inside the cavity 124, as shown in FIG. 2A. The outer dimensions of the seal ring substrate 110 will vary in order to expose a portion of each of the conductors 122 on the outside of the package 100, as is also shown in FIG. 2A. These exposed portions of the RF substrate conductors are used as the connection point for the electronic device or devices 116 inside the package to the next component outside the package.

Referring again to FIG. 1, the ceramic lid 114 may be made of the same or a similar material as that used for the RF substrate 106 and/or the seal ring substrate 110 layers. The third attaching means, a non-conductive polymer adhesive, e.g., epoxy 112, is affixed to the bottom of the ceramic lid in a window frame fashion in order to adhere the ceramic lid 114 to the seal ring substrate 110. Alternatively, the third attaching means may be a low temperature seal glass. Either the bottom or the top of the ceramic lid 114 may be coated with a material that reduces cavity resonances.

The package 100 can transmit and receive electrical signals with minimal loss and uses a minimal amount of conductive and non-conductive materials. The package also eliminates the need for a stripline type of transmission line through a ceramic wall. The construction of the package is not limited to a single material combination, but can use a variety of materials, both conductive and dielectric, to produce a package suitable for high frequency electronic devices.

The inventive package 100 satisfies the requirements for a microelectronics package suitable for high frequency devices, using a minimum of conductive materials. First, the package satisfies the structural requirements of resistance to thermal and mechanical shock, moisture, salt atmosphere, vibration, and acceleration, as well as having the characteristic of solderability. Perhaps more importantly, the package provides hermeticity. The package also satisfies several electrical requirements, including low parasitic effects (i.e., inductance and capacitance), minimal discontinuity reactances, low dissipation loss, and minimal interaction with surrounding devices and environment.

In order to meet the requirements for high frequency feedthrough, an impedance match low-loss interconnect for the device to the outside of the package is required. This minimizes or eliminates the need for tuning the device for optimal performance. To meet this requirement, a package must have low insertion loss (less than 0.02f dB.GHz) and high return loss (greater than 15 dB) over the operating frequency band. To meet the requirements for high frequency feedthrough, the feedthrough structure should be planar, provide a good match for the electrical and magnetic fields at all interfaces, have a minimum number of transitions along the signal path, have a minimum number of discontinuities in the ground path, have a minimum feedthrough length (but long enough to reduce interaction between discontinuities), and have minimum ground inductance.

Historically, a feedthrough structure consisted of a planar transition medium of a microstrip to stripline to microstrip. A microstrip transmission line consists of a metalized conductor above a ground plane, separated by a dielectric material. A stripline transmission line consists of a metalized conductor between two ground planes, separated by dielectric materials. The stripline region in a feedthrough is constructed in one of two ways: (1) by inserting the feedthrough into an aperture of a metal housing, creating a ground environment above and below the planar conductor, or (2) by connecting the metalization above the conductor electrically to metalization below the conductor by a vertical metalized via and/or external metalization. The position and width of the stripline conductor to the upper and lower ground conductors, as well as the ground electrical lengths, determine the characteristic impedance. The width to position of the microstrip connector to the ground plane determines its characteristic impedance.

A cavity within a package (such as the cavity formed by the base 102, the RF substrate 106, the seal ring substrate 110, and the lid 114) must house the electronic device without degrading its performance and must accommodate high frequency feedthroughs and DC-lines. The design of the cavity should preclude propagation of waveguide modes and cavity resonances. In previous approaches using either metalized packages or multi-layer ceramic packages with metalized walls and lids, the ground potential of the lid 114 was a concern, because a grounded lid helps improve isolation between the feedthroughs and shield the device from any environmental effects. In the present invention, the cavity of the package is designed so that the cutoff frequency for the dominant $TE_{10}$ wave guide mode is beyond the maximum operating frequency. If this condition is not met, there is a possibility that the energy injected into the package, which is carried by the TEM mode, may couple to the $TE_{10}$ mode or any other modes supported by the cavity. At higher frequencies this mode conversion may influence the insertion loss in the package more than the dissipated loss or the impedance mismatch in the feedthrough. Cavity size that does not support waveguide modes additionally improves the isolation between feedthroughs and prevents spurious mode propagation.

Figure 3:
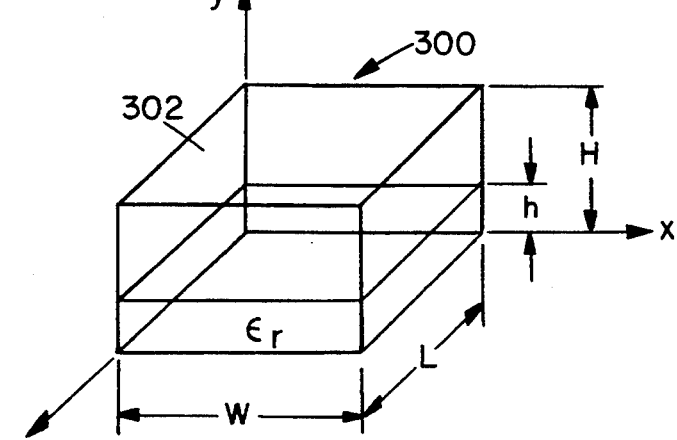
FIG. 3 is a diagrammatical representation of a cavity in a microelectronic package, in which the electromagnetic wave is propagating in the z-direction.

As illustrated in FIG. 3, a package cavity 302 can be treated as an H-plane dielectric slab-loaded structure 300, where the electromagnetic wave is propagating in the z-direction. The dominant waveguide mode in the cavity can be either quasi-$TE_{10}$ or $LSM_{11}$ (longitudinal-section magnetic), depending on the dielectric constant value and waveguide dimensions.

Figure 4:
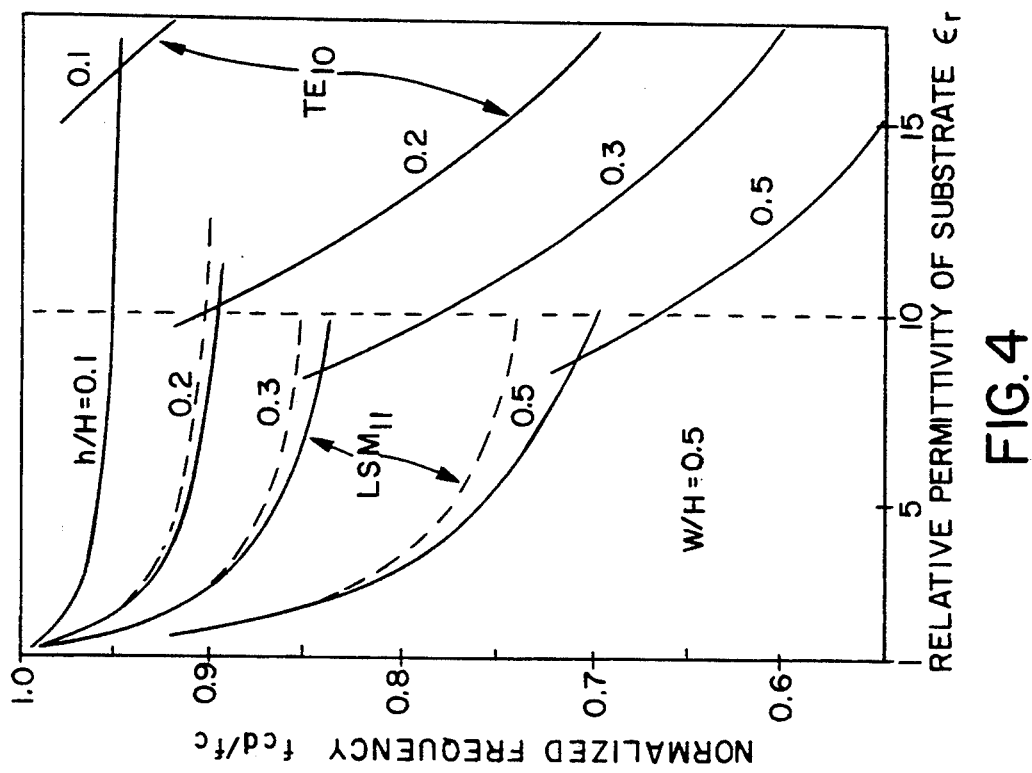
FIG. 4 is a plot of cutoff frequencies for $LSM_{11}$ and $TE_{10}$ modes in an empty rectangular waveguide.

As illustrated in FIG. 4, the cutoff frequencies (designated $f_{cd}$) for both the quasi-$TE_{10}$ and the $LSM_{11}$ cases, as normalized with respect to the $TE_{10}$ mode cutoff frequency ($f_c = c/2W$, W being the x-dimension) in an empty rectangular waveguide, are determined by the following equation:

$$\frac{f_{cd}}{f_c} = \sqrt{1 - \frac{h}{H}\left(\frac{\epsilon_r - 1}{\epsilon_r}\right)}. \quad (1)$$

As shown in FIG. 3, for equation (1), h, H and $\epsilon_r$ are the substrate thickness, cover height, and substrate dielectric constant respectively.

In order to suppress waveguide cutoff modes W/H should be less than 0.5, and h/H should be less than 0.1. For heavier loading of the package, the $TE_{10}$ mode becomes dominant, and significantly lower cutoff frequencies are observed. Thus, care must be taken during design of the cavity and feedthroughs to avoid exciting these modes.

For waveguide dimensions H<W<L, the lowest order resonant mode is $LSM_{111}$, or $TE_{101}$. The electric field plane for such dimensions is parallel to the x-y plane and is maximum at the center, falling sinusoidally to zero at the walls of the waveguide. The magnetic field lines are closed contours parallel to the x-z plane, and the field strength is maximum at the walls and minimum at the center of the waveguide. The resonant frequency for this configuration is given by the following equation:

$$f_o = \frac{15}{W}\left(\sqrt{1 - \frac{h}{H}\left(\frac{\epsilon_r - 1}{\epsilon_r}\right)}\sqrt{1 + \left(\frac{W}{L}\right)}\right)^2, \quad (2)$$

where W is in centimeters and $f_o$ is in GHz.

As can be seen in equation (2), the lowest resonant frequency occurs when L is very large as compared to W and is given by the cutoff frequency for the dominant mode. Resonance can also occur when the largest dimension equals half the waveguide wavelength.

Figure 5:
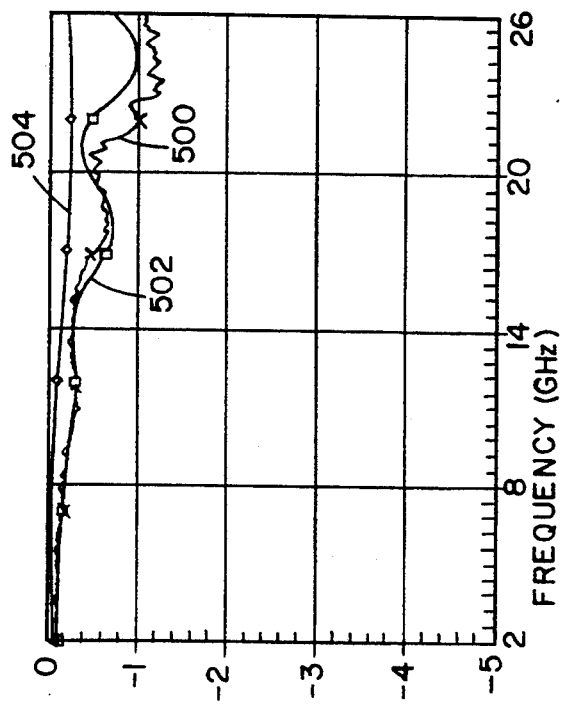
FIG. 5 is a plot of electrical transmission loss with frequency.
Figure 6:
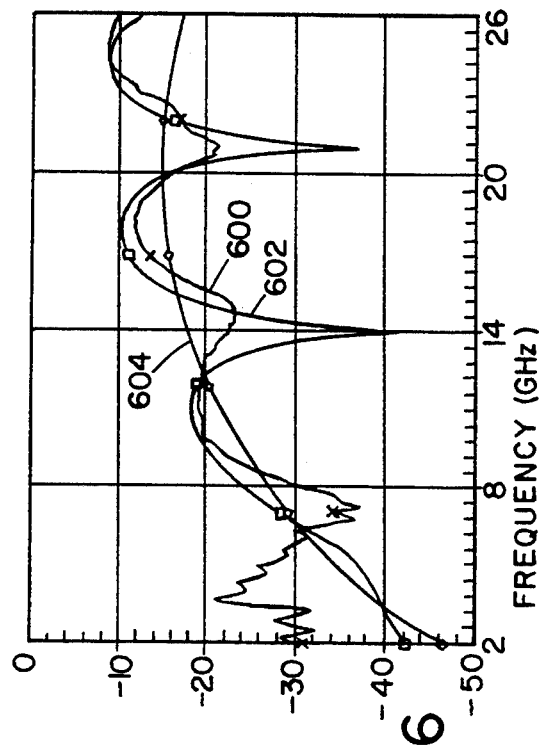
FIG. 6 is a plot of the reflected loss with frequency.

As can be seen in FIGS. 5 and 6, the results of a feedthrough for the high frequency package 100 of the present invention are well within the requirements described above for high frequency feedthrough.

FIG. 5 illustrates the measurement and modeling results of the electrical transmission loss incurred through the package 100 of the present invention, displaying the loss as a function of frequency. FIG. 5 also shows the modeled, or predicted, results of the single feedthrough of the package. A first curve 500 and a second curve 502 (identified respectively by an "X" and a box) are the measured and modeled results, respectively, of the package 100. The measurement was made of two package feedthroughs, two ribbon bonds, and a microstrip transmission line mounted in the cavity area formed by the RF substrate 106, the seal ring substrate 110, and the ceramic lid 114 across the full length of that cavity to connect both feedthroughs. Creating an electrical model to represent all of the physical components, and adjusting the model to obtain a fit of the measured response, permits analysis of individual components of interests. In the example depicted in FIG. 5, the complete package 100, a microstrip, and ribbon bonds were analyzed, the feedthrough being analyzed independently. The modeled result of the independent feedthrough is identified by a third curve 504 (identified by a diamond). This approach, called de-embedding, is commonly used in the electronics industry.

FIG. 6 displays the amount of reflected loss a signal experiences when propagating from one medium to another. As in FIG. 5, a first curve 600 and a second curve 602 (identified respectively by "X" and a box) for the measured and modeled results, respectively, of the package 100. A third curve 604 (identified by a diamond) is the modeled result of a single feedthrough.

Another aspect of the present invention is a process for assembling a ceramic microelectronic package. The process includes the following steps: Screen printing a pattern of conductive paste; drying and firing the conductive paste; etching to further define the pattern of conductive paths in the conductive paste; screen printing a first seal glass layer on the top of the RF substrate; drying and glazing the first seal glass layer; screen printing a second seal glass layer on the bottom of the seal ring substrate; drying and glazing the second seal glass layer; assembling the ceramic RF substrate to the ceramic seal ring substrate; and attaching the top surface of the base to the bottom surface of the ceramic RF substrate.

Before beginning the process, fully fired (hardened) ceramics are selected for the ceramic RF substrate 106, the ceramic seal ring substrate 110, and the ceramic lid 114. Preferably, the same ceramic is selected for each component. As for the base 102, if it is made of a ceramic, it could be the same fully fired ceramic selected for the other components, or it could be a different ceramic material which is compatible with the RF substrate but may have either better electrical or thermal properties. Any of the ceramic substrates may be alumina ($Al_2O_3$) Of various purities (e.g., 96%, 99.6%), berrylia (BeO), Barium Titanate ($BaTiO_3$), fused silica ($SiO_2$), or aluminum nitride (AlN), the material being selected to meet the specialized requirements of the product to be assembled. For example, aluminum nitride and berrylia are desirable for high power, heat dissipative applications.

Fully fired (hardened) ceramics are commercially available from ceramic vendors. A fully fired ceramic substrate is typically purchased in one inch to 4.5 inch blanks, with the size selected according to the product to be assembled and the quantity of product desired.

The ceramic RF substrate 106, preferably 96% pure alumina, is fabricated as follows. The RF substrate is cleaned ultrasonically using a detergent suitable for electronic applications and rinsed with deionized water, then fired to burn out any residues from the detergent. Preferably, an Alconox detergent is used, although those skilled in the art will recognize that other detergents can be used.

Next, a conductive paste is screen printed over the top surface of the ceramic RF substrate 106. A first method of defining the conductive traces is to provide a preliminary conductive pattern which has significantly larger dimensions than the desired final dimensions of conductive pattern 122. The photolithography/etch sequence described below will then be used to define the final dimensions of the conductive traces. A second possible method is to screen print the conductive paste using a screen that provides the actual final dimensions of the conductive pattern 122. If the second method is selected, no etch step is required.

After the conductive paste is printed over the substrate, it is dried. The RF substrate 106 is then fired according to the specifications provided by the manufacturer of the conductive paste.

With respect to the first method of defining the conductive pattern 122, the method of forming the preliminary conductive pattern uses thick film screen printing techniques, as are known in the art. Depending on the application and the type of conductor used, it may be desirable to repeat the printing sequence at least once to attain greater thickness and more uniform density of material, with each printing step being followed by drying and firing steps. The firing temperature, time, and conditions depend on the type of conductive material used, the appropriate parameters being provided by the supplier of the conductive paste. Preferably, the printing, drying, and firing steps will be performed twice in the present invention. The second method for defining the conductive pattern 122 requires similar processing after the conductive paste is printed onto the RF substrate.

A large number of conductive pastes are available, and the selection of such a paste will depend upon the product being fabricated. Many pastes are combinations of gold and glass, with variations in the mixtures providing various levels of hermeticity, wire bondability, solderability, etchability, and adhesion. Other possible pastes include silver or copper. Selection of the appropriate paste for the desired product quality falls within the level of skill in the art. Preferably, however, an etchable gold conductor is used in the present invention, and the preferred embodiment is described accordingly.

When a preliminary conductive pattern with dimensions larger than the desired final dimensions is in place on the RF substrate 106, a photolithographic process is used to more precisely define the dimensions of the conductors after which an etch is performed to remove the excess conductive material. This patterning step follows the process as is known in thin film technology in which a photoresist (PR) layer is spun or otherwise coated onto the surface of the preliminary conductive pattern; the PR is exposed to ultraviolet light modulated by a mask bearing the desired pattern; and the unexposed PR is rinsed away using a developer, leaving the areas to be etched exposed. The etch solution which is used for gold conductors is a mixture of potassium-iodine and iodine. After etching, the PR is stripped, and a clean/fire step is performed to burn away any chemical or organic residues remaining after the etching step. This technique is used to define the ultimate dimensions of the conductive traces 122 to assure that all of the conductor's dimensions, including thickness, are uniform and within the tolerances desired for reliable operation.

After the clean/fire step, a seal glass is screen printed on the top surface of the RF substrate to form second attaching means 108. Note that seal glass may be deposited on either or both of the seal ring substrate and the RF substrate. If seal glass is to be deposited on the top of the RF substrate, it will substantially match the dimensions of the seal ring substrate 110, which has a larger cavity than that of the RF substrate. Thus, the seal glass will not completely cover the top surface of the RF substrate. Multiple printings of seal glass may be done in order to obtain the desired total thickness, with the preferred embodiment including three such printing steps. After each printing step, the seal glass paste is dried and glazed. Because the RF substrate 106 is also to be joined to the base 102, a seal glass may be printed onto the bottom surface of the RF substrate if the base is ceramic. As described above, depending on the material chosen for the base 102, the bottom side of the RF substrate 106 may be metalized or may have a seal glass layer placed on it.

The glazing temperature is selected to be high enough that volatile materials (organics) within the glass are burned off, but not so high that the conductor on the substrates will melt or flow. The temperature depends on the type of material used, and appropriate temperature ranges are provided by the glass manufacturer. Some slight adjustments in temperature may be necessary due to variations between different types of ovens. Such adjustments are within the level of skill in the art. The selection of the seal glass is dominated by the type of product to be fabricated. An important feature of the present invention is that the seal glass be selected to have a coefficient of thermal expansion (CTE) and dielectric constant that match as close as possible the CTE and dielectric constant of the ceramic selected for the substrates. Matching of the CTEs eliminates differential thermal stress between each layer of a multilayer structure.

Separate from the fabrication of the RF substrate 106, the ceramic seal ring substrate 110 is fabricated. As with the RF substrate layer, a ceramic material is selected which is fully fired and thus already hardened, the preferred ceramic being 96% pure alumina. The ceramic is the same as that selected for the RF substrate. In the preferred embodiment, the seal ring substrate is cut to create a cavity 124 at its center. This machining is generally performed by laser ablation using a $CO_2$ laser, which is the industry standard machining technique. Other machining techniques that may be used are ultrasonic machining or wire cutting. Other types of lasers may be used as well. The cavity cut into the seal ring is larger than the corresponding cavity that will be cut in the RF substrate, as is apparent from the drawings. The resulting ceramic seal ring substrate may then be mechanically scrubbed to remove any laser slag that may have built up on the substrate.

After removing the laser slag (if necessary), the seal ring substrate 110 is cleaned ultrasonically using a detergent, preferably Alconox, and fired to burn off any residues from the detergent.

As previously mentioned, since the second attaching means 108 may be formed by deposition of seal glass on one or both of the RF substrate and seal ring substrate, the following step will be incorporated only if seal glass is to be deposited on the bottom of the seal ring.

A seal glass layer is applied to the bottom of the seal ring substrate. As with the RF substrate 106, application of the seal glass layer requires screen printing, drying and glazing, which steps may be performed a number of times, depending on the materials used, to attain the desired thickness.

Upon fabricating the RF substrate 106 and the seal ring substrate 110, the two substrates are subassembled, requiring several steps. First, the substrates are aligned and mated for proper assembly, then the subassembly is fired, during which it may be weighted or clamped together to promote proper lamination and hermeticity between the two substrates. After firing, it may be desirable to check the hermeticity of the seal. The subassembly may be cleaned and inspected, then is laser machined to create the center cavity 120 in RF substrate 106, after which it is inspected again. The laser slag is removed by scrubbing.

Second, the subassembly is cleaned ultrasonically using a detergent, preferably 111- trichloroethylene, to remove any grease and is rinsed with deionized water. The subassembly is then fired to burn away any residues left from the detergent.

Third, a conductive paste is applied to the bottom surface of the subassembly (i.e., the bottom surface of the RF substrate 106), and the screen printed conductive paste is then dried and fired, as described above. Again, the preferred conductive paste is a gold paste, and the print-dry-fire step can be performed multiple times to achieve the desired thickness. After applying the conductive paste, the subassembly may be singulated by sawing; that is, each independent subassembly may be separated from the blank.

After completing the subassembly, final assembly of the package is performed. First, an appropriate base must be selected. In the preferred embodiment the base is made from Kovar ®. A hermeticity check may be performed on the subassembly before final assembly; and the subassembly may be cleaned and fired as necessary. Before attaching the base 102 to the subassembly, the bottom surface of the RF substrate may be smoothed in order to prepare the subassembly for soldering. Preparation techniques may vary, depending on the type of solder used. These techniques may affect the amount of solder flow, hermeticity, and visual quality of the assembly. Next, the base 102 and the subassembly are fitted together with attaching means 104 therebetween, and the fitted assembly is fired. After firing, a final hermeticity check may be run; the assembly may be cleaned using an acetone or other detergent to remove grease and other residues; and electrical testing may be performed on sample packages.

After completion of the package, the microelectronic circuit to be packaged therein is attached using die attach techniques as are known in the art. The ceramic lid is then attached to the top of seal ring 110 by a non-conductive polymer adhesive 112, such as epoxy, or a seal glass which can be fired and glazed at a sufficiently low temperature to avoid damaging the microelectronic circuit. The process for using a non-conductive polymer adhesive 112 comprises screen printing the polymer onto the bottom side of lid 114, then pre-baking the lid 114 to partially cure the adhesive. Once the microelectronic circuit is mounted inside the package, the lid 114 is aligned with the ceramic seal ring 110 then clamped in place, after which a final cure is performed at a temperature that is low enough to avoid damage to the microelectronic circuit.

It will be apparent to those skilled in the art that various modifications and variations can be made in the apparatus and process of the present invention without departing from the spirit or scope of the invention. Thus, it is intended that the present invention cover the modification and variations of this invention provided they come within the scope of the appended claims and their equivalence.

We claim:

1. A process for assembling a ceramic microelectronic package for retaining an integrated circuit, said ceramic package having a base, a ceramic RF substrate, and a ceramic seal ring substrate, each of said base, said ceramic RF substrate, and said ceramic seal ring substrate having a top surface and a bottom surface, said process comprising:
    forming a conductive pattern on said top surface of said ceramic RF substrate;
    cutting a first cavity in said ceramic seal ring substrate;
    forming at least one of a first seal glass layer on said top surface of said ceramic RF substrate and a second seal glass layer on said bottom surface of said ceramic seal ring substrate;
    abutting said ceramic RF substrate and said ceramic seal ring substrate together to form a subassembly;
    firing said subassembly;
    cutting a second cavity in said ceramic RF substrate, said second cavity being smaller than said first cavity but larger than said integrated circuit;
    printing a conductive layer on said bottom surface of said ceramic RF substrate; and
    attaching said top surface of said base to said bottom surface of said ceramic RF substrate, including the substeps of applying an adhesive material in the alternative to said top surface of said base or to said bottom surface of said ceramic RF substrate, abutting said top surface of said base to said bottom surface of said ceramic RF substrate to form an assembly, and firing said assembly.

2. The process recited in claim 1 wherein the step of forming a conductive pattern comprises screen printing a conductive paste on said top surface of said RF substrate.

3. The process recited in claim 2 wherein the step of printing a conductive pattern further comprises:
    forming a protective mask of photoresist over a selected portion of said conductive pattern; and
    etching to remove a non-selected portion of said conductive pattern.

4. The process recited in claim 1 wherein the step of forming a first seal glass layer includes selecting a seal glass having a coefficient of thermal expansion substantially equal to a second coefficient of thermal expansion of the ceramic RF substrate and the ceramic seal ring substrate.

5. The process recited in claim 1 wherein the step of forming a second seal glass layer includes selecting a seal glass having a coefficient of thermal expansion substantially equal to a second coefficient of thermal expansion of the ceramic RF substrate and the ceramic seal ring substrate.

6. The process recited in claim 1 wherein the base is formed from a conductive metal, and wherein the adhesive material comprises a metal solder material.

7. The process recited in claim 1 wherein the base is formed from a ceramic material having a partial metalization, and wherein the adhesive material comprises a metal solder material.

8. The process recited in claim 1 wherein the base is formed from a ceramic material having a partial metalization, and wherein the adhesive material comprises a first seal glass and a second seal material fused together, said first seal glass being applied to the top of said base and said second seal glass being applied to the bottom of said ceramic RF substrate.

9. The process recited in claim 1 further comprising attaching a ceramic lid to said top surface of said ceramic seal ring substrate using a non-conductive sealing means.

10. A process for assembling a ceramic microelectronic package for retaining a microelectronic device, said ceramic package having a base, a ceramic RF substrate, a ceramic seal ring substrate, and a ceramic lid, each of said base, said ceramic RF substrate, said ceramic seal ring substrate and said ceramic lid having a top surface and a bottom surface, said process comprising:
    screen printing a conductive pattern onto said top surface of said ceramic RF substrate;
    cutting a first cavity in said ceramic seal ring substrate;
    screen printing at least one of a first seal glass layer on said top surface of said ceramic RF substrate and a second seal glass layer on said bottom surface of said ceramic seal ring substrate;
    abutting said ceramic RF substrate and said ceramic seal ring substrate together to form a subassembly;
    firing said subassembly;
    cutting a second cavity in said ceramic RF substrate, said second cavity being smaller than said first cavity but larger than said integrated circuit;
    screen printing a conductive layer on said bottom surface of said ceramic RF substrate;
    attaching said top surface of said base to said bottom surface of said ceramic RF substrate, including the substeps of applying an adhesive material in the alternative to said top surface of said base or to said bottom surface of said ceramic RF substrate, abutting said top surface of said base to said bottom surface of said ceramic RF substrate to form an assembly, and firing said assembly; and
    screen printing a non-conductive adhesive onto said bottom surface of said lid;
    partially curing said non-conductive adhesive;
    mounting said microelectronic device within said second cavity;
    attaching said bottom surface of said lid to said top surface of said ceramic seal ring; and
    curing said non-conductive adhesive.

11. The process recited in claim 10 wherein the step of screen printing a conductive pattern onto the top surface of said RF substrate further comprises:
    forming a protective mask of photoresist over a selected portion of said conductive pattern; and
    etching to remove a non-selected portion of said conductive pattern.

* * * * *